(12) United States Patent
Peake

(10) Patent No.: US 7,579,649 B2
(45) Date of Patent: Aug. 25, 2009

(54) TRENCH FIELD EFFECT TRANSISTOR AND METHOD OF MAKING IT

(75) Inventor: Steven T. Peake, Warrington (GB)

(73) Assignee: NXP B.V., Eindhoven (NL)

( * ) Notice: Subject to any disclaimer, the term of this patent is extended or adjusted under 35 U.S.C. 154(b) by 451 days.

(21) Appl. No.: 10/591,192

(22) PCT Filed: Feb. 23, 2005

(86) PCT No.: PCT/IB2005/050654

§ 371 (c)(1),
(2), (4) Date: Aug. 30, 2006

(87) PCT Pub. No.: WO2005/088724

PCT Pub. Date: Sep. 22, 2005

(65) Prior Publication Data

US 2007/0181940 A1    Aug. 9, 2007

(30) Foreign Application Priority Data

Mar. 3, 2004    (GB) .................................. 0404751.0

(51) Int. Cl.
*H01L 29/78* (2006.01)
(52) U.S. Cl. ............... 257/331; 257/341; 257/E29.131; 438/270; 438/259
(58) Field of Classification Search ................. 257/341, 257/331, E29.131
See application file for complete search history.

(56) References Cited

U.S. PATENT DOCUMENTS 5,708,286 A * 1/1998 Uesugi et al. ................ 257/330
7,253,475 B2 * 8/2007 Schaffer ...................... 257/341

* cited by examiner

*Primary Examiner*—Jerome Jackson, Jr.
*Assistant Examiner*—Paul A Budd

(57) ABSTRACT

Consistent with an example embodiment, a trench FET has source regions arranged above insulated gates in trenches. A body region of opposite conductivity type is arranged between the trenches and a body region is arranged above the body region. Source contact metallisation contacts the source and body contact region. In this way a small cell pitch can be achieved.

14 Claims, 4 Drawing Sheets

TRENCH FIELD EFFECT TRANSISTOR AND METHOD OF MAKING IT

The invention relates to a trench field effect transistor (trench-FET) and to a method of making it.

An example of a prior art trench semiconductor structure is illustrated in FIG. 1. An n-type drain layer 4 is provided over an n+ substrate 2, and a p-type body layer 20 is provided on the drain layer 4. A trench 6 extends through the body layer 20 as far as the drain layer 4, and includes a conductive gate 10 insulated from the body layer by a gate insulator 9. N+ source diffusions 14 are provided adjacent to the trench. Gate electrode 26 connects to the gate 10, source electrode 22 connects to the source 14 and body 20 and drain electrode 24 connects to the substrate 2.

In use, a voltage is applied to the gate electrode 26 to control a channel extending in the body layer 20 adjacent to the trench 6 between the source 14 and drain 4.

A reduction of the cell pitch, i.e. the distance between adjacent cells, of a trench-FET is generally desirable, as the lower the cell pitch the greater the channel width for a fixed area of silicon. Thus, the specific on-resistance, i.e. the resistance of the FET when switched on per unit area, may be reduced by lowering the cell pitch.

The reduction in cell pitch requires a reduction in the width of either the trench region, containing the gate, and/or the mesa region, i.e. the region with implanted source and body regions.

Recently, a reduction in mesa width has been obtained by a blanket source implantation. In the schematic of FIG. 1 above, both the body region and the source region are exposed at the first major surface. In the technique of blanket source implantation, the source region is implanted over the whole of the mesa at the first major surface leaving the body below the source region. Since it is no longer necessary to have both source and body at the first major surface of the mesa, the mesa width can be reduced.

The downside of this approach is that it is still necessary to contact the body. This is achieved by a moat etch through the source region to the body region and a highly doped contact implant in the body region to provide a contact to the body region at the base of the moat etch. If the contact implant were to diffuse to the channel the device would become hard to turn on. It is therefore necessary that the moat is spaced away from the channel by some distance. Thus, there are limits to how far the cell pitch can be reduced using this approach.

There thus remains a need to reduce the cell pitch of trench-FET structures.

According to the invention, there is provided a trench field effect transistor (trench-FET) comprising:

a semiconductor body having opposed first and second major surfaces;

a source metallisation at the first major surface;

source contact regions of semiconductor doped to have a first conductivity type at the first major surface in contact with the source metallisation;

body contact regions of semiconductor doped to have a second conductivity type opposite to the first conductivity type at the first major surface in contact with the source metallisation;

a drain region of first conductivity type under the first major surface;

a drain contact connected to the drain region; and insulated gates including a conductive gate in an insulated trench for controlling current flow between the source contact region and the drain region through mesa regions between the insulated gates, wherein the source contact regions and base contact regions alternate laterally across the first major surface, with the source contact regions arranged in the insulated trench above the insulated gate.

By providing the source regions above the insulated gate the cell pitch can be substantially reduced.

For example, in preferred embodiments of the invention the cell pitch can be reduced below 1 micron. Pitches below 0.5 micron may be achieved.

Preferably, the mesa regions comprise doped body regions of semiconductor doped to have the second conductivity type extending under the body contact region to the drain region, the doped body regions having a lower doping density than the body contact regions.

The source contact region may extend to a greater depth than the base contact region so that the source contact region is in direct contact with the doped body region under the body contact region. This means that current can flow from the source contact region through the doped body region past the insulated gate to the drain region.

In embodiments, the first conductivity type is n-type and the second conductivity type p-type, the p-type doping of the body contact region being above $5 \times 10^{18}$ cm$^{-3}$, the p-type doping of the body region being in the range $10^{17}$ cm$^{-3}$ to $10^{18}$ cm$^{-3}$, and the doping of the n-type source contact region being above $10^{19}$ cm$^{-3}$.

The drain region may include a drift region of lower doping above a highly doped drain region of higher doping than the drift region, both drain and drift regions being of the first conductivity type.

The doping in the drift region may be below $10^{17}$ cm$^{-3}$, preferably below $5 \times 10^{16}$ cm$^{-3}$, although the exact value will depend on the properties required and especially the breakdown voltage. The doping in the highly doped drain region may above $10^{18}$ cm$^{-3}$, and is preferably highly conducting with a doping density above $10^{19}$ cm$^{-3}$, to reduce the overall resistance of the device.

The drift region may be formed as an epitaxial layer on a highly doped substrate forming the highly doped drain region. Alternatively the drift region and/or drain regions may be formed by implanting dopants.

It is not necessary that the source contact regions are confined to the trenches and the source contact regions may extend laterally outside the confines of the trenches as well as above the insulated gate so that the width of the body contact regions between the source contact regions is narrower than the width of the mesa regions between the trenches. This can reduce the effects of current crowding at the top corner of the insulated gates. Such source contact regions extending outside the confines of the trench may be made simply by annealing the structure to allow the dopants in the source contact region to diffuse outwards, so such a structure is not difficult to manufacture.

In another aspect, the invention relates to a method of manufacturing a trench-FET, including the steps of:

providing a semiconductor having opposed first and second major surfaces doped to be of first conductivity type to form a drain region;

implanting a body contact region at the first major surface of semiconductor doped to be of a second conductivity type opposite to the first conductivity type;

forming trenches laterally across the first major surface alternating laterally with the body contact regions, the trenches extending below the body contact regions defining mesa regions below the body contact regions between the trenches;

forming insulated gates in the trenches;

depositing source regions of semiconductor doped to be of the first conductivity type in the trenches above the insulated gates; and depositing a source metallisation at the first major surface contacting the source regions and the body contact regions.

It is of particular benefit that the body contact region may be formed by implantation at the whole of the first major surface since the unwanted doping will be removed when forming the trenches.

The method may include the step of implanting body regions of second conductivity type to a first depth greater than the depth of the source contact regions wherein the body contact implantation is carried out to a second depth less than the depth of the source contact regions so that the body contact region lies above the body regions in the finished FET.

The step of forming insulating gates in the trenches may include the steps of forming insulator on the sidewalls and base of the trenches, forming gate conductor in the trenches to a depth below the top of the trenches and forming gate-source insulator in the trenches above the gate conductor.

For a better understanding of the invention, embodiments will be described with reference to the accompanying drawings in which.

Note that the Figures are schematic and not to scale and that like or similar components are shown with the same reference numeral in different Figures.

Figure 1:
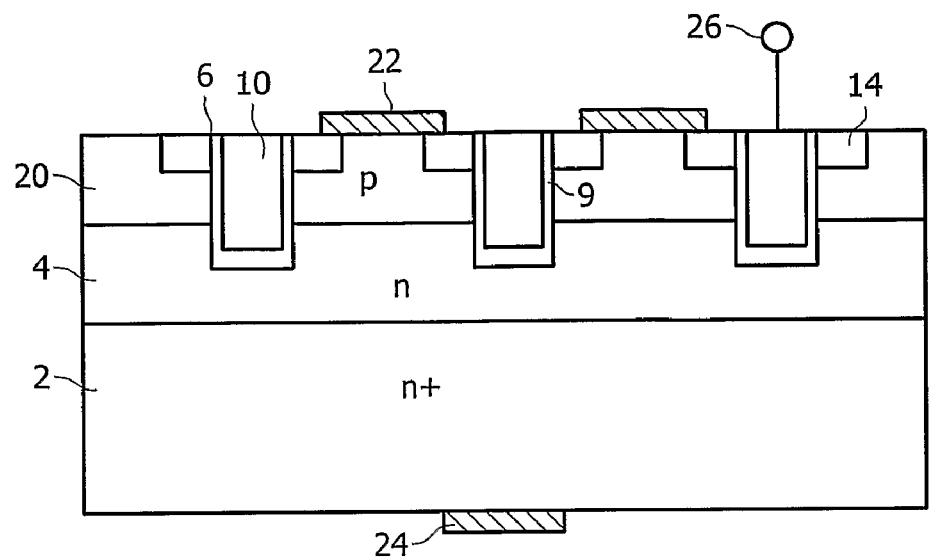
FIG. 1 illustrates a prior art trench-FET.
Figure 2:
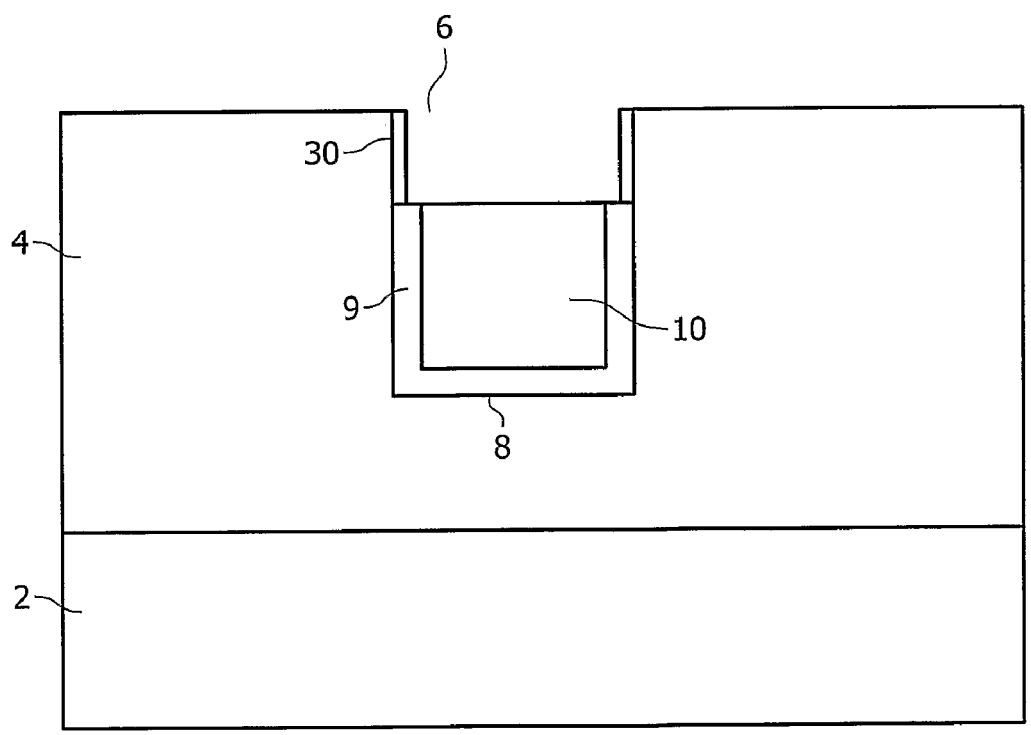
FIG. 2 illustrates a first step in a process according to a first embodiment of the invention.

The manufacture of the device is largely conventional except for the filled trenches. FIG. 2 illustrates a step in the manufacture of one of these trenches.

To form the trenches 6, a mask, conveniently of photoresist, is patterned and the epilayer 4 etched to define trenches 6 extending through epilayer 4 towards substrate 2. Insulator is formed on the sidewalls 9 and base 8 of the trenches 6 and gate polysilicon 10 deposited in the trenches 6 and doped. Next, the gate polysilicon 10 is etched down below the top of the substrate to the required depth in the trench. The mask is then removed.

A nitride layer 30 is deposited over the whole surface to a thickness of 30 nm to 100 nm. Next, a spacer etch is performed which removes the nitride from all surfaces except the sidewalls arriving at the structure shown in FIG. 2.

A wet oxidation step is carried out to grow oxide on the polysilicon gate region.

Next, hot phosphoric acid is used to etch away the nitride. Phosphoric acid selectively etches nitride and does not etch oxide.

Polysilicon is deposited in the top of the trench, and doped with arsenic to a doping density of $1\times10^{21}$ cm$^{-3}$ to form source regions 14.

Figure 3:
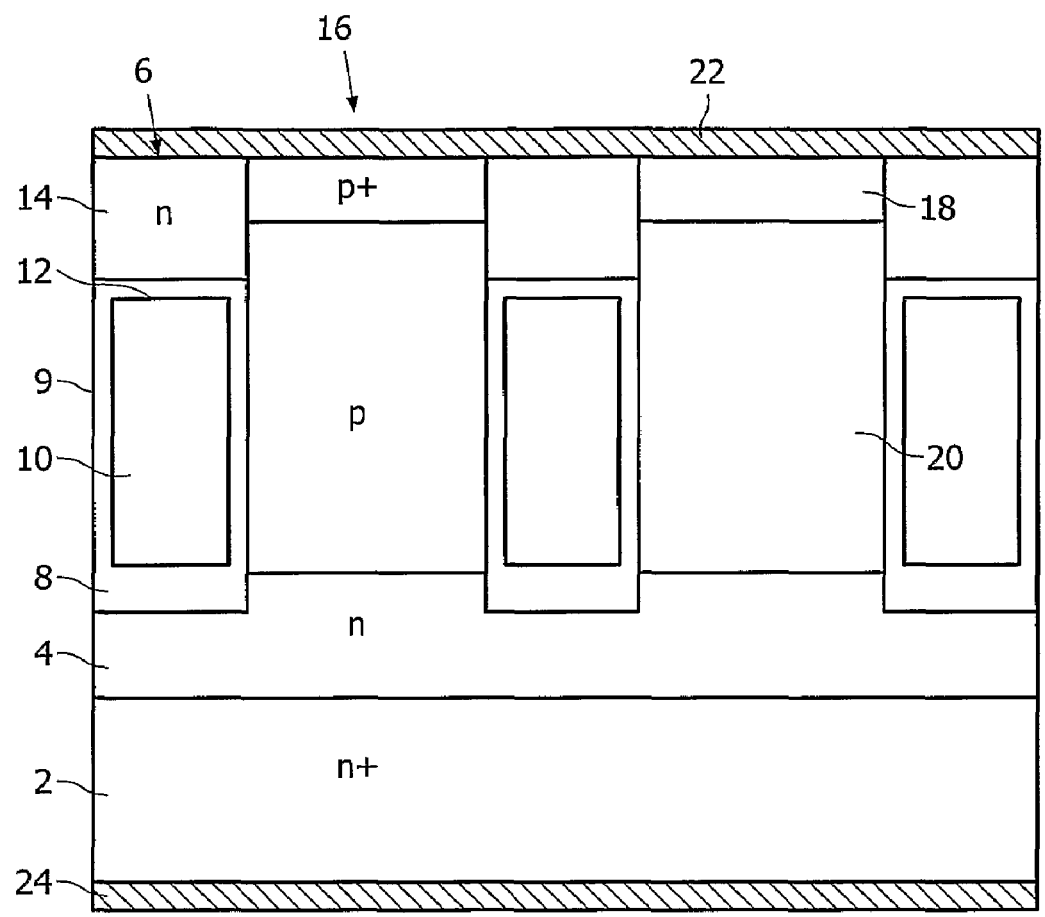
FIG. 3 illustrates the trench FET according to the first embodiment.

Subsequent processing follows standard processes to arrive at the finished structure of FIG. 3.

It is a particular benefit of the method that the implants to form both the body region 20 and the body contact region 18 can be made over the whole of the surface unlike the contact to the body formed in a prior art structure using a moat etch, in which prior art structure the body contact implant needs to be kept away from the channel.

In the finished device, as shown in FIG. 3, highly doped n+ substrate 2 forms the drain and epilayer 4 forms the drift region. The epi-layer is doped $3\times10^{16}$ cm$^{-3}$ n-type.

Trenches 6 extend from the first major surface into epilayer 4. The trenches 6 include a thick trench base insulator 8 on the base of the trench, gate insulator 9 on the sidewalls of the trench 6, a conductive gate electrode 10, in the example of doped polysilicon filling the trench, and a gate-source insulator 12 above the gate electrode 10. Source region 14 of n+-doped semiconductor fills the top of the trench to a depth of 0.3 μm.

Mesa region 16 between the trenches includes a body contact region 18 at the top surface heavily doped p+, in the example $2\times10^{19}$ cm$^{-3}$, extending to a depth of 0.25 micron. Below the body contact region 18 is the body region 20, extending to meet the drain region 4 between the trenches. The slightly shallower depth of the body contact region 18 than the source region 14 helps reduce the current crowding at the top corner of the insulated gate 10.

Source contact 22 extends along the top of the first major surface contacting the source regions 14 and body contact regions 18. The source regions 14 and body contact regions 18 are arranged in stripes across the surface extending in the direction into the paper in FIG. 3.

A drain contact 24 contacts the rear of the substrate 2. As will be appreciated, in alternative embodiments a highly doped epi-layer 4 can be used and contact made directly to the epilayer.

Figure 4:
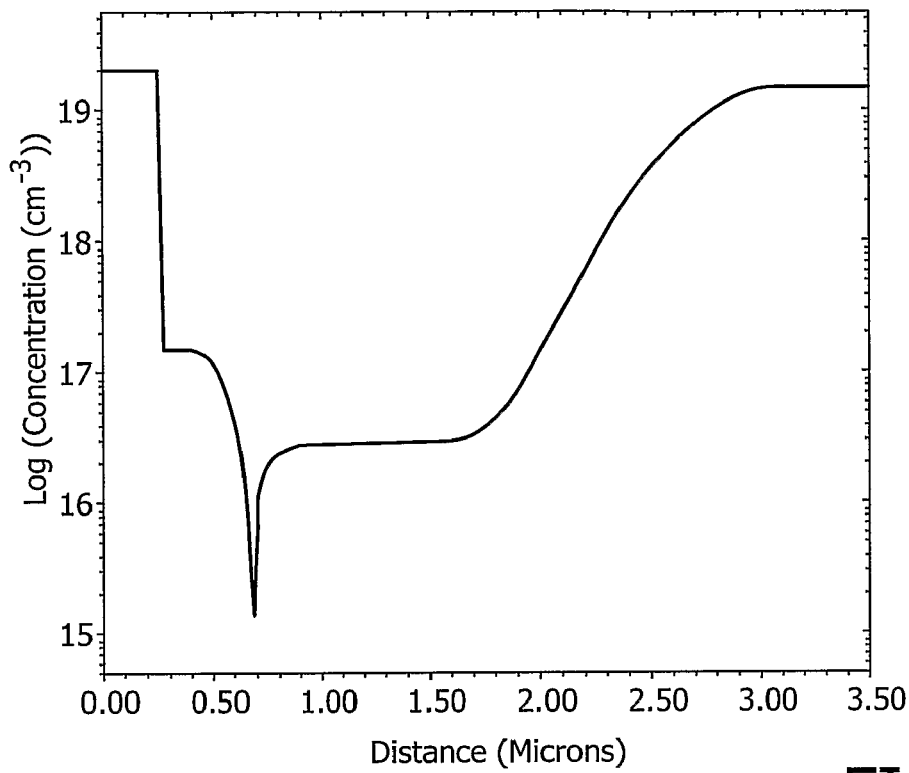
FIG. 4 shows a simulated doping profile for the first embodiment.

FIG. 4 shows the doping profile in the mesa region measured from the top surface.

Figure 5:
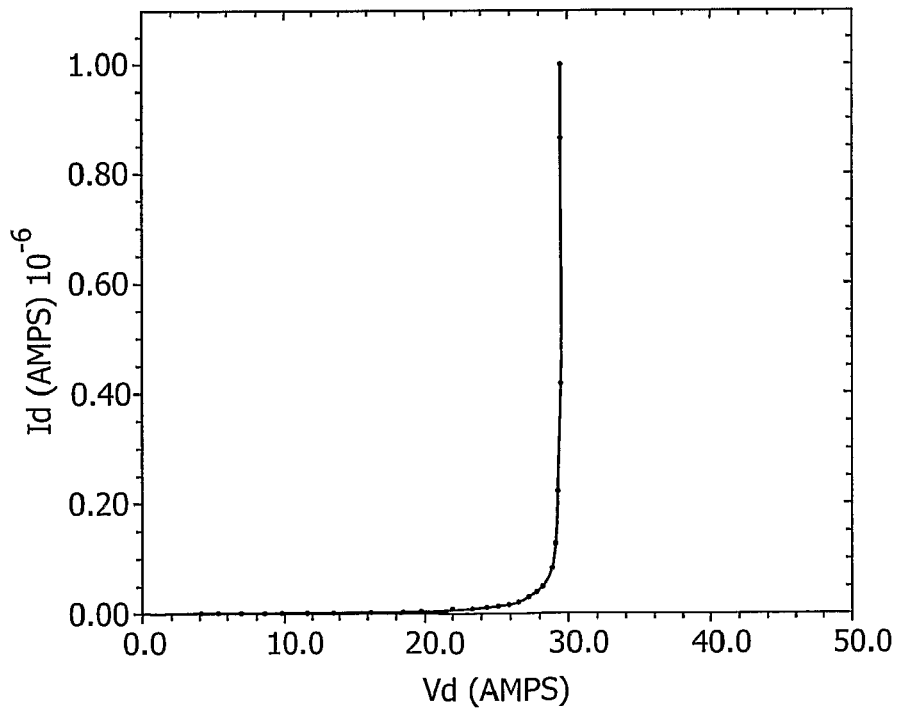
FIG. 5 shows the current with the device switched off as a function of source-drain voltage.

FIG. 5 shows the current with the device switched off with 1.5V applied to the gate as a function of applied drain-source voltage. Breakdown at 29.5 V can be clearly seen.

Figure 6:
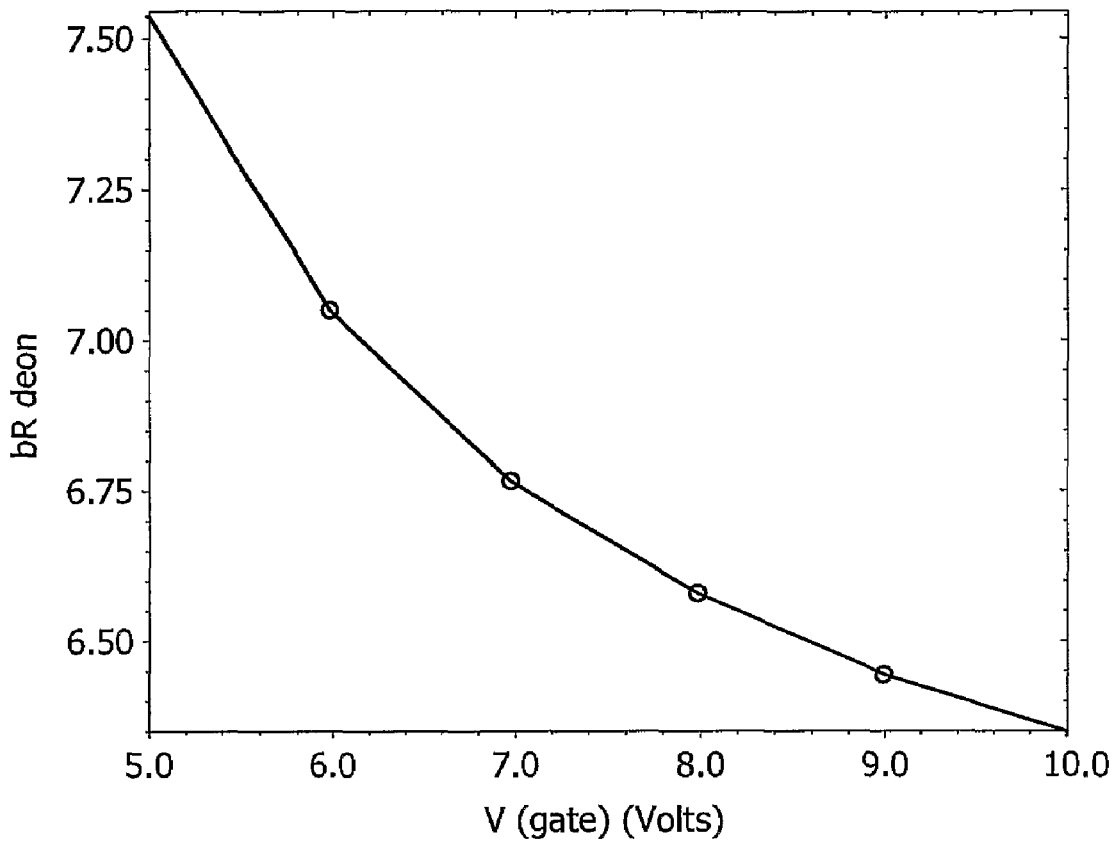
FIG. 6 shows simulated specific Rdson values for the first embodiment.

FIG. 6 shows the specific on-resistance Rdson with the device turned on at a number of gate voltages. With a gate voltage of 10V the specific on resistance is 6.2 mΩ·mm² from the device of which the substrate makes a contribution of 3.6 mΩ·mm². Thus the device has a very low specific on-resistance.

This is achieved using a very simple structure which importantly is easy to manufacture with very small cell pitch.

The skilled person will appreciate that a number of modifications may be made to the embodiments without departing from the scope of the invention. In particular, the n- and p-type regions may be interchanged.

The invention is not just applicable to silicon as the semiconductor but may be applied in any suitable semiconductor including for example GaAs. Further, the device is of simple form and may be used not merely on a single crystal substrate but also as part of thin film transistors.

From reading the present disclosure, other variations and modifications will be apparent to persons skilled in the art. Such variations and modifications may involve equivalent and other features which are already known in the design, manufacture and use of more boilerplate and which may be used in addition to or instead of features described herein. Although claims have been formulated in this application to particular combinations of features, it should be understood that the scope of disclosure also includes any novel feature or any novel combination of features disclosed herein either explicitly or implicitly or any generalisation thereof, whether or not it mitigates any or all of the same technical problems as does the present invention. The applicants hereby give notice that new claims may be formulated to any such features and/or combinations of such features during the prosecution of the present application or of any further applications derived therefrom.

The invention claimed is:

1. A trench field effect transistor (trench-FET) comprising:
   a semiconductor body having opposed first and second major surfaces;
   a source metallisation at the first major surface; source contact regions of semiconductor doped to have a first conductivity type at the first major surface in contact with the source metallisation;
   body contact regions of semiconductor doped to have a second conductivity type opposite to the first conductivity type at the first major surface in contact with the source metallisation;
   a drain region of first conductivity type under the first major surface; a drain contact connected to the drain region; and
   insulated gates including a conductive gate in an insulated trench for controlling current flow between the source contact region and the drain region through mesa regions between the insulated gates,
   wherein the source contact regions and body contact regions alternate laterally across the first major surface, with the source contact region arranged in the insulated trench above the insulated gate;
   wherein the mesa regions comprise doped body regions of semiconductor doped to have the second conductivity type extending under the body contact regions to the drain region, the doped body regions having a lower doping density than the body contact regions.

2. A trench-FET according to claim 1 wherein the source contact regions extend to a greater depth than the base contact regions so that the source contact regions are in direct contact with the doped body regions under the body contact regions so that current can flow from the source contact regions through the doped body regions past the insulated gate to the drain regions.

3. A trench-FET according claim 1, wherein the first conductivity type is n-type and the second conductivity type p-type, the p-type doping of the body contact region being above $5 \times 10^{18}$ cm$^{-3}$, the p-type doping of the body region being, in the range of $1 \times 10^{17}$ cm$^{-3}$ to $1 \times 10^{18}$ cm$^{-3}$ and the doping of the n-type source contact region being above $1 \times 10^{19}$ cm$^{-3}$.

4. A trench-FET according to claim 1, wherein the drain regions include a drift region of lower doping above a highly doped drain region of higher doping than the drift region, both drain and drift regions being of the first conductivity type.

5. A trench-FET according to claim 4 wherein the doping in the drift region is below $1 \times 10^{17}$ cm$^{-3}$ and the doping in the highly doped drain region is above $1 \times 10^{18}$ cm$^{-3}$.

6. A trench-FET according claim 1, wherein the source contact regions extend laterally outside the confines of the trenches as well as above the insulated gate so that the width of the body contact regions between the source contact regions is narrower than the width of the mesa regions between the trenches.

7. A method of manufacturing a trench-FET, including the steps of:
   providing a semiconductor body having opposed first and second major surfaces doped to be of first conductivity type to form a drain region;
   implanting a body contact region at the first major surface of semiconductor doped to be of a second conductivity type opposite to the first conductivity type;
   forming trenches laterally across the first major surface alternating laterally with the body contact regions, the trenches extending below the body contact regions defining mesa regions below the body contact regions between the trenches;
   forming insulated gates in the trenches;
   depositing source regions of semiconductor doped to be of the first conductivity type in the trenches above the insulated gates; and
   depositing a source metallisation at the first major surface contacting the source regions and the body contact regions; and
   implanting body regions of second conductivity type to a first depth greater than the depth of the source contact regions wherein the body contact implantation is carried out to a second depth less than the first depth.

8. A method according to claim 7 wherein the step of forming insulating gates in the trenches includes the steps of forming insulator on the sidewalls and base of the trenches, forming gate conductor in the trenches to a depth below the top of the trenches and forming gate-source insulator in the trenches above the gate conductor.

9. A trench field effect transistor (trench-FET) comprising:
   a semiconductor body having opposed first and second major surfaces;
   a source metallisation at the first major surface; source contact regions of semiconductor doped to have a first conductivity type at the first major surface in contact with the source metallisation;
   body contact regions of semiconductor doped to have a second conductivity type opposite to the first conductivity type at the first major surface in contact with the source metallisation;
   a drain region of first conductivity type under the first major surface; a drain contact connected to the drain region; and
   insulated gates including a conductive gate in an insulated trench for controlling current flow between the source contact region and the drain region through mesa regions between the insulated gates,
   wherein the source contact regions and body contact regions alternate laterally across the first major surface, with the source contact region arranged in the insulated trench above the insulated gate; and
   wherein the source contact regions extend laterally outside the confines of the trenches as well as above the insulated gate so that the width of the body contact regions between the source contact regions is narrower than the width of the mesa regions between the trenches.

10. A trench-FET according to claim 9 wherein the mesa regions comprise doped body regions of semiconductor doped to have the second conductivity type extending under the body contact regions to the drain region, the doped body regions having a lower doping density than the body contact regions.

11. A trench-FET according to claim 10 wherein the source contact regions extend to a greater depth than the base contact regions so that the source contact regions are in direct contact with the doped body regions under the body contact regions so that current can flow from the source contact regions through the doped body regions past the insulated gate to the drain regions.

12. A trench-FET according claim 10, wherein the first conductivity type is n-type and the second conductivity type p-type, the p-type doping of the body contact region being above $5\times10^{18}$ cm$^{-3}$, the p-type doping of the body region being, in the range of $1\times10^{17}$ cm$^{-3}$ to $1\times10^{18}$ cm$^{-3}$ and the doping of the n-type source contact region being above $1\times10^{19}$ cm$^{-3}$.

13. A trench-FET according to claim 9, wherein the drain regions include a drift region of lower doping above a highly doped drain region of higher doping than the drift region, both drain and drift regions being of the first conductivity type.

14. A trench-FET according to claim 13 wherein the doping in the drift region is $1\times10^{17}$ cm$^{-3}$ and the doping in the highly doped drain region is above $1\times10^{18}$ cm$^{-3}$.

* * * * *